(12) United States Patent
Yoshida et al.

(10) Patent No.: US 6,740,561 B2
(45) Date of Patent: May 25, 2004

(54) METHOD OF MANUFACTURING A SEMICONDUCTOR DEVICE

(75) Inventors: Yoshifumi Yoshida, Chiba (JP); Jun Osanai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/093,791

(22) Filed: Mar. 7, 2002

(65) Prior Publication Data

US 2002/0151129 A1 Oct. 17, 2002

(30) Foreign Application Priority Data

Apr. 4, 2001 (JP) ........................................ 2001-106102

(51) Int. Cl.[7] ............................................ H01L 21/331
(52) U.S. Cl. ........................................ 438/309; 438/510
(58) Field of Search .................................. 438/309, 510

(56) References Cited

U.S. PATENT DOCUMENTS

| | | | | |
|---|---|---|---|---|
| 3,793,090 A | * | 2/1974 | Barile et al. ................ | 438/591 |
| 4,703,551 A | * | 11/1987 | Szluk et al. ................ | 438/220 |
| 5,840,610 A | * | 11/1998 | Gilmer et al. .............. | 438/301 |
| 6,403,423 B1 | * | 6/2002 | Weybright et al. .......... | 438/279 |

* cited by examiner

Primary Examiner—John F. Niebling
Assistant Examiner—Christopher Lattin
(74) Attorney, Agent, or Firm—Adams & Wilks

(57) ABSTRACT

There is provided a semiconductor device in which improvement of drive capacity and miniaturization are made. A P-type transistor is composed of a surface channel type transistor so that a channel length is easily reduced. Thus, improvement of drive capacity and miniaturization are promoted. Further, since a gate insulating film is nitrided, reliability of the gate insulating film is improved and passing of boron contained in a p-type polycrystalline silicon gate electrode toward a channel region can be prevented. A step of forming the gate insulating film, a step of nitriding the gate insulating film, a step of performing thermal treatment using an inert gas, a step of forming a gate electrode on the gate insulating film, and a step of introducing a p-type impurity into the gate electrode are performed. Thus, a surface channel P-type transistor and a buried channel N-type transistor are constructed.

30 Claims, 3 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device of a field effect type having a MOS structure. More specifically, the present invention relates to a method of manufacturing a semiconductor device which composes a semiconductor integrated circuit such as a voltage regulator, switching regulator, or a voltage detector, which is used for controlling a power source voltage of a portable device or the like.

2. Description of the Related Art

A conventional technique will be described with reference to FIGS. 3A to 3D. Description will be made of a complementary MOSFET device (CMOS) formed on a single crystalline semiconductor substrate as the conventional technique. First, as shown in FIGS. 3A to 3C, an N-type well 34, a field insulator 33, N-type low concentration impurity regions 39, N-type high concentration impurity regions 41 and 42, P-type high concentration impurity regions 43 and 44, P-type low concentration impurity regions 40, and gate electrodes 36 (for an NMOS and a PMOS) made of N-type polycrystalline silicon doped with phosphorus are formed on a P-type semiconductor substrate 31 by using a conventional manufacturing method for an integrated circuit.

The manufacturing method in detail is as follows. First, $BF_2^+$ ions are implanted into a P-type silicon wafer having an impurity concentration of about $1E15/cm^3$, and the field insulator 33 is formed by a so-called LOCOS method. Further, phosphorus ions are implanted into the P-type silicon wafer, and annealing is performed at 1000° C. for 3 to 10 hours. Thus, the phosphorus ions are diffused and distributed again to form the N-type well 34 having an impurity concentration of about $1\times10^{16}$ cm$^{-3}$.

Thereafter, a gate insulating film (silicon oxide) having a thickness of 20 to 100 nm is formed by a thermal oxidation method, and a polycrystalline silicon film having a thickness of 500 nm and a phosphorus concentration of $1\times10^{21}$ cm$^{-3}$ is formed by a low pressure CVD method. These films are patterned to form portions 36 serving as the gate electrodes.

Then, the N-type low concentration impurity regions 39 having an impurity concentration of $1\times10^{18}$ cm$^{-3}$ are formed and pocket regions having an impurity concentration of about $1\times10^{19}$cm$^{-3}$ are optionally formed by an ion implantation method using the portions serving as the gate electrodes and another mask (if necessary). In addition, the P-type low concentration impurity regions 40 having an impurity concentration of $1\times10^{18}$ cm$^{-3}$ are formed, and pocket regions having an impurity concentration of about $1\times10^{17}$ cm$^{-3}$ are formed if required.

Next, as shown in FIG. 3C, the N-type high concentration impurity regions 41 and 42, and the P-type high concentration impurity regions 43 and 44 are respectively formed with a space for each of the portions 36 serving as the gate electrodes by an ion implantation method. In any impurity region, the impurity concentration is set to about $1\times10^{21}$ cm$^{-3}$.

Finally, as in the case where an ordinary integrated circuit is manufactured, a phosphorous glass layer 46 is formed as an interlayer insulating film. For example, a low pressure CVD method is preferably used for the formation of the phosphorous glass layer 46. Monosilane ($SiH_4$), oxygen ($O_2$), and phosphine ($PH_3$) are used as material gases and reacted at 450° C. to obtain the phosphorous glass layer 46. Then, holes for electrode formation are formed in the interlayer insulating film and aluminum electrodes 45 are formed therein. Thus, a complementary MOS device shown in FIG. 3D is completed.

With respect to the semiconductor device manufactured by the above-mentioned conventional manufacturing method, in the case of an enhancement type NMOS (hereinafter referred to as an E-type NMOS) having a normal reference threshold voltage of about 0.7 V, the gate electrode is made of polycrystalline silicon having an N$^+$-type. Thus, from a relationship of work functions between the gate electrode and a semiconductor substrate, the channel is a surface channel formed on the surface of the semiconductor substrate. On the other hand, in the case of an enhancement type PMOS (hereinafter referred to as an E-type PMOS) having a normal reference threshold voltage of about −0.7 V, from a relationship of work functions between the gate electrode made of an N$^+$-type polycrystalline silicon and an N-well, the channel becomes a buried channel formed somewhat inside the semiconductor substrate than the surface of the semiconductor substrate.

In order to realize a low voltage operation, when a threshold voltage is set to, for example, −0.5 V or more in the buried channel E-type PMOS, a subthreshold characteristic as one index for low voltage operation of the MOS transistor is extremely deteriorated. Thus, a leak current at an off state of the PMOS is increased. As a result, since a consumption current during standby of the semiconductor device is markedly increased, there arises a problem in that an application to portable devices represented by a mobile telephone and a portable terminal which are said to increase demand in recent years and to further expand the market in the future is difficult.

On the other hand, as a technical method of making a low voltage operation and a low consumption current as the above objects compatible, a so-called homopolar gate technique in which a conductivity type of the gate electrode of an NMOS is made to be an N-type and a conductivity type of the gate electrode of a PMOS is made to be a P-type is generally known. In this case, both an E-type NMOS transistor and an E-type PMOS transistor are surface channel MOS transistors. Thus, even when a threshold voltage is reduced, extreme deterioration of a subthreshold coefficient is not actualized and both low voltage operation and a low consumption current are enabled.

However, there are the following problems in cost and characteristics. That is, with respect to a homopolar gate CMOS, the gates in both an NMOS and a PMOS are formed to be different polarities in manufacturing steps. Thus, as compared with a CMOS having a gate electrode made of only an N$^+$-polycrystalline silicon unipole, the number of steps is increased and increases in a manufacturing cost and a manufacturing period are caused. Further, with respect to an inverter circuit as a most fundamental circuit element, generally, in order to improve area efficiency, the gates of the NMOS and the PMOS is laid out such that a connection through metal is avoided, using a piece of polycrystalline silicon which is two-dimensionally continued from the NMOS to the PMOS or a polycide structure composed of a laminate of polycrystalline silicon and high melting metallic silicide. However, when the gate is made of polycrystalline silicon as a single layer, it is impractical due to a high impedance of a PN junction in the polycrystalline silicon. Also, when the gate is made of the polycide structure, an N-type impurity and a P-type impurity each are diffused to respective gate electrodes having an inverse conductivity type through the high melting metallic silicide at high speed during a thermal treatment of steps. As a result, a work function is changed and a threshold voltage is unstable.

SUMMARY OF THE INVENTION

An object of the present invention is to provide a structure capable of realizing a power management semiconductor device and an analog semiconductor device, in which a low cost, a short manufacturing period, a low voltage operation, and low power consumption are enabled.

Therefore, in order to solve the above-mentioned object, according to the present invention, the following means are adopted.

(1) There is employed a method of manufacturing a semiconductor device of a complementary MOS type including an N-channel MOS transistor and a P-channel MOS transistor comprising the steps of: forming a gate insulating film; nitriding the gate insulating film; performing thermal treatment using an inert gas; forming a gate electrode on the gate insulating film; and introducing a p-type impurity into the gate electrode.

(2) There is employed a method of manufacturing a semiconductor device in which the gate electrode is made of polycrystalline silicon.

(3) There is employed a method of manufacturing a semiconductor device in which the gate electrode has a polycide structure composed of a laminate of polycrystalline silicon, high melting metallic silicide, and an insulating film.

(4) There is employed a method of manufacturing a semiconductor device in which the inert gas is $N_2$.

(5) There is employed a method of manufacturing a semiconductor device in which an annealing temperature using the inert gas is 925° C. or higher.

(6) There is employed a method of manufacturing a semiconductor device in which a film thickness of the polycrystalline silicon is in a range of from 2000 Å to 5000 Å.

(7) There is employed a method of manufacturing a semiconductor device in which in the polycide structure, a film thickness of the polycrystalline silicon is in a range of from 2000 Å to 4500 Å and a film thickness of the high melting metallic silicide is in a range of from 500 Å to 3000 Å.

(8) There is employed a method of manufacturing a semiconductor device in which the step of introducing the P-type impurity is ion implantation.

(9) There is employed a method of manufacturing a semiconductor device in which the step of introducing the P-type impurity includes a step of forming a glass film containing a P-type ion and a step of performing annealing.

(10) There is employed a method of manufacturing a semiconductor device in which the step of introducing the P-type impurity includes a step of forming polycrystalline silicon by a low pressure CVD method in a gas atmosphere containing a P-type ion.

DETAILED DESCRIPTION OF THE PREFERRED EMBODIMENT

Hereinafter, an embodiment of the present invention will be described based on the drawings. In this embodiment, a case where a complementary type transistor is formed on a P-type semiconductor substrate will be described. However, the present invention can be also applied to a case where it is formed on an N-type semiconductor substrate.

Figure 1A:
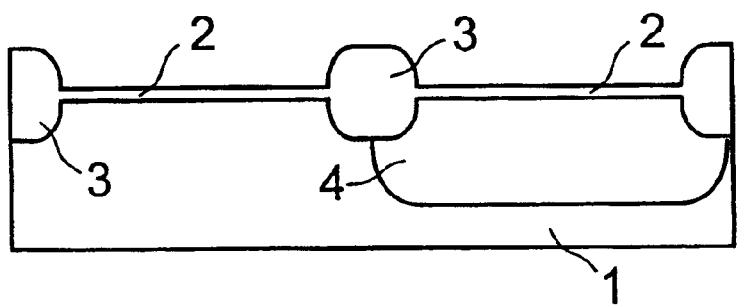
FIGS. 1A to 1D are cross sectional views showing a method of manufacturing a semiconductor device according to the present invention.

As shown in FIG. 1A, phosphorus ions are implanted into the vicinity of the surface of a P-type semiconductor substrate 1 and annealing is performed at 1000 to 1175° C. for 3 to 20 hours. Thus, the phosphorus ions are diffused and distributed again to form an N-type well 4 having an impurity concentration of about 1E16 $cm^3$. Subsequently, $BF^+$ ions are implanted into a patterned region and a channel stopper and a field insulator 3 are formed by a so-called LOCOS method (FIG. 1A). After that, the arsenic ion implantation for threshold voltage control to desired channel regions and the formation of a gate insulating film (silicon oxide) 2 having a thickness of 10 to 30 nm by a thermal oxidation method are performed.

Figure 1B:
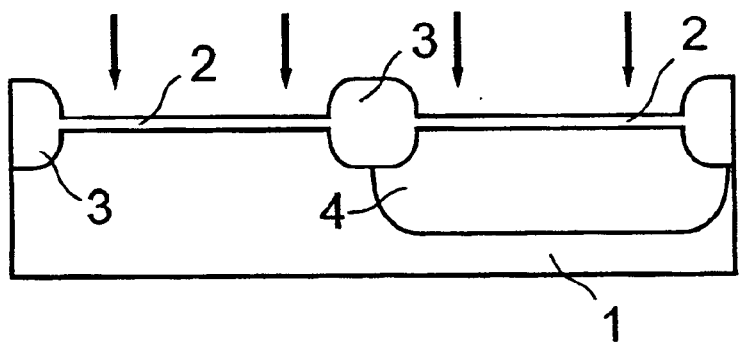

Then, nitriding processing is performed for the gate insulating film 2. When this processing is performed, an interface level, a trap, a dangling bond of crystal in an interface of the gate insulating film are filled with nitrogen. Thus, it is prevented that boron contained in a polycrystalline silicon gate electrode is diffused to the gate oxide film; a hot electron resistance is increased; and the reliability of the gate insulating film is improved. Generally, this processing is performed at a very high temperature by an RTA (rapid thermal annealing) using a lamp anneal or the like. For example, processing in an $N_2O$ atmosphere at 800 to 1125° C. for 15 to 120 seconds or processing in an $NH_3$ atmosphere at 800 to 1100° C. for 5 to 90 seconds is performed, and then processing in an $O_2$ atmosphere at 800 to 1125° C. for 15 to 120 seconds is performed. During this nitriding processing, a distortion of a silicon semiconductor substrate wafer due to the presence of oxygen is caused. In particular, in the case of processing at a higher temperature higher than 1000° C., the distortion becomes remarkable. Thus, according to a manufacturing method of the present invention, annealing in an inert gas atmosphere, for example, in a nitrogen atmosphere at 925 to 1025° C. for 10 to 30 minutes or annealing in an argon atmosphere at 925 to 1025° C. for 10 to 30 minutes is then performed by a thermal oxidation furnace. The distortion of the silicon semiconductor substrate wafer is corrected by the inert gas annealing (FIG. 1B).

Figure 1C:
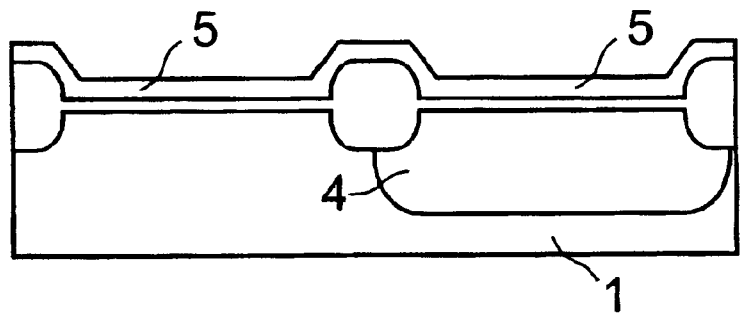
Figure 1D:
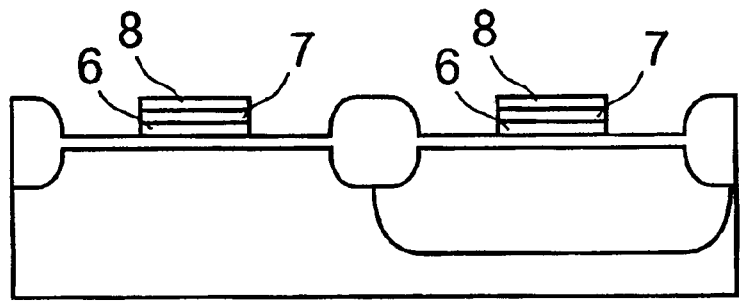

Next, a polycrystalline silicon film 5 having a thickness of 2000 to 5000 Å is formed by a low pressure CVD method or the like (FIG. 1C). Then, P-type ions are implanted into the polycrystalline silicon film 5. Here, according to the present invention, there can be employed three ion introducing methods.

As for the first ion introducing method, the polycrystalline silicon film 5 is formed, and then B or $BF_2$ is implanted thereinto at a concentration of $1 \times 10^{19}$ atoms/$cm^3$ or higher by ion implantation. Thus, the polycrystalline silicon film 5 becomes a P-type.

As for the second ion introducing method, when the polycrystalline silicon film 5 is formed by a low pressure CVD method, the formation is performed in a gas containing a P-type ion. Thus, the polycrystalline silicon film becomes a P-type at the same time of the film formation.

As for the third ion introducing method, the polycrystalline silicon film 5 is formed, and then a glass layer containing boron ions at a high concentration is formed by a low pressure CVD method or the like. Thereafter, annealing is performed to diffuse the boron ions into the polycrystalline silicon film 5. Then, the glass layer is peeled to form a P-type polycrystalline silicon film.

After the formation of the P-type polycrystalline silicon film 5, a metallic silicide film 7 having a thickness of about 500 to 2500 Å is formed thereon by a sputtering method or the like. Then, an oxide film 8 having a thickness of about 1000 to 3000 Å is formed on the metallic silicide film 7 by a low pressure CVD method or the like. These films are patterned to form a P-type polycrystalline silicon gate electrode 6.

Here, the thickness of the P-type polycrystalline silicon gate electrode 6 is considered. In the case of the same ion implantation concentration, when the gate electrode is thin, its sheet resistance becomes small and thus it is advantage. However, boron used for implantation of a P-type ion is easy to pass the oxide film. Therefore, since a boron, which is ion-implanted to the P-type polycrystalline silicon gate electrode 6, passes the gate insulating film 2 and penetrates the channel region of the transistor, this becomes a cause for a variation in characteristics of the transistor. Thus, there is a method of preventing the penetration of boron to the channel region by reducing the ion implantation concentration. However, according to the present invention, a film thickness of the polycrystalline silicon gate electrode is set to 2000 Å or more. Thus, it is prevented that boron passes the polycrystalline silicon gate electrode 6 to penetrate the channel region of the transistor at ion implantation. In the case where it is set to less than 2000 Å, boron passes the polycrystalline silicon gate electrode 6 by an energy generated at the time of ion formation and penetrates the channel region through the gate insulating film in thermal treatment of later processes to cause a variation in characteristics. On the other hand, when the polycrystalline silicon gate electrode 6 is thick (2000 Å or more), although passing of boron can be prevented, an increase in a sheet resistance is caused. In the case of a circuit for which the transistor of the present invention is used, since a sheet resistance is 1 kΩ/square or lower, a thickness of the polycrystalline silicon gate electrode 6 which is required for satisfying this becomes 5000 Å or less. As a result, when a gate electrode is the P-type polycrystalline silicon gate electrode 6 as a single layer, its thickness becomes 2000 Å to 5000 Å.

Also, the film thickness of the metallic silicide film 7 is considered. Since a sheet resistance required for high speed operation and high frequency support is over ten Ω/square or lower, the thickness of the metallic silicide film which is required for satisfying this becomes 500 Å or more. In addition, the sheet resistance is reduced as the film thickness of the metallic silicide film 7 is increased. However, since the metallic silicide film 7 is formed on the polycrystalline silicon gate electrode 6 in processes, a step becomes large. An allowable range of the height (thickness) of the step during the process is below 4500 Å, because the sum of the thickness of the polycrystalline silicon gate electrode and that of the metallic silicide film is 5000 Å or less. Thus, the film thickness of the polycrystalline silicon gate electrode 6 is 4500 Å or less. Further, in order to prevent passing of boron which is concerned at the time of the ion implantation for forming the P-type polycrystalline silicon gate electrode 6, the thickness of the polycrystalline silicon gate electrode 6 is set to 2000 Å or more. From the above conditions, in the case of the gate electrode using the metallic silicide film 7, the film thickness of the polycrystalline silicon gate electrode 6 is within a range of 2000 Å to 4500 Å and the film thickness of the metallic silicide film 7 is within a range of 500 Å to 3000 Å.

Thereafter, although not shown, $N^+$-type impurity regions each having an impurity concentration of about 1E21 $cm^{-3}$ are formed in regions serving as a source and a drain of an N-type transistor for protecting a CMOS from an external noise charge. Here, phosphorus having a large diffusion coefficient is used as the N-type dopant.

Figure 2A:
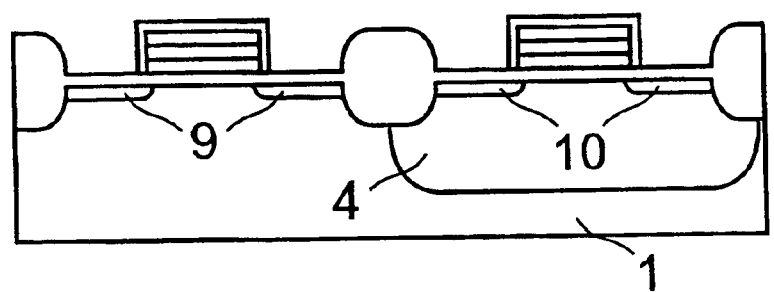
FIGS. 2A to 2C are cross sectional views showing the method of manufacturing the semiconductor device according to the present invention.

Next, N-type low concentration impurity regions 9 each having an impurity concentration of about $1\times10^{16}$ to $1\times10^{18}$ atoms/$cm^3$ and P-type low concentration impurity regions 10 each having an impurity concentration of about $1\times10^{16}$ to $1\times10^{18}$ atoms/$cm^3$ are formed in portions of the source and drain regions to overlap a portion of the polycrystalline silicon gate electrode 6. Thus, a state shown in FIG. 2A is obtained.

Figure 2B:
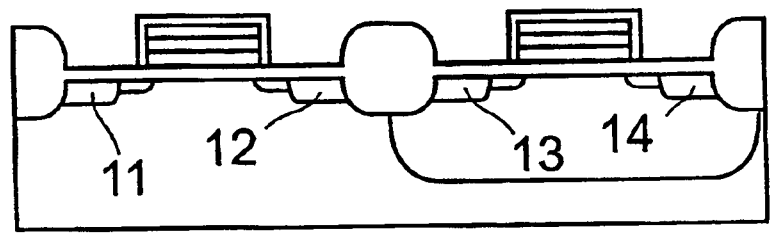

Next, N-type high concentration impurity regions 11 and 12 and P-type high concentration impurity regions 13 and 14 are formed again by an ion implantation method. In any impurity region, the impurity concentration is set to $1\times10^{19}$ atoms/$cm^3$ or higher (FIG. 2B). At this time, a space is prepared between the gate electrode and the high concentration impurity regions. In the case of a drain applying voltage of 7 V, the space is set to about 0.5 to 1.0 $\mu$m. In the case of 10 V, it is set to about 0.7 to 2.0 $\mu$m. In the case of 36 V, it is set to about 2.0 to 5.0 $\mu$m.

Here, concentrations of the low impurity concentration region and the high impurity concentration region are considered. Since the sheet resistance of the polycrystalline silicon gate electrode 6 is limited to be 1 kΩ/square or lower, a concentration of the high impurity concentration region becomes $1\times10^{19}$ atoms/$cm^3$ or higher. Since a drain applying voltage of the transistor used in the present invention is assumed to be several V to 40 V, a concentration of the low impurity concentration region is within a range of $1\times10^{16}$ to $1\times10^{18}$ atoms/$cm^3$. Also, low concentration P-type impurity regions 10 contain boron or $BF_2$ at a concentration of about $1\times10^{16}$ to $1\times10^{18}$ atoms/$cm^3$ and the low concentration N-type impurity regions 9 contain phosphorus or arsenic at a concentration of about $1\times10^{16}$ to $1\times10^{18}$ atoms/$cm^3$. On the other hand, high concentration P-type impurity regions 13 and 14 contain boron or $BF_2$ at a concentration of $1\times10^{19}$ atoms/$cm^3$ or higher and the high concentration N-type impurity regions 11 and 12 contain phosphorus or arsenic at a concentration of $1\times10^{19}$ atoms/$cm^3$ or higher.

Further, in the present invention, when an N-type impurity is implanted using the P-type polycrystalline silicon gate electrode 6 as a mask, an increase in a resistance and depletion of the gate electrode due to a reduction in a concentration of the P-type polycrystalline silicon gate electrode 6 are concerned. In order to solve such a problem, the oxide film 8 is formed on the P-type polycrystalline silicon gate electrode 6. Alternatively, the metallic silicide film 7 is formed on the P-type polycrystalline silicon gate electrode 6 and the oxide film 8 is formed thereon. Thus, when an N-type impurity 9 is implanted using the P-type polycrystalline silicon gate electrode 6 as a mask, it is possible that the implantation of the N-type impurity into the P-type polycrystalline silicon gate electrode 6 is prevented.

Figure 2C:
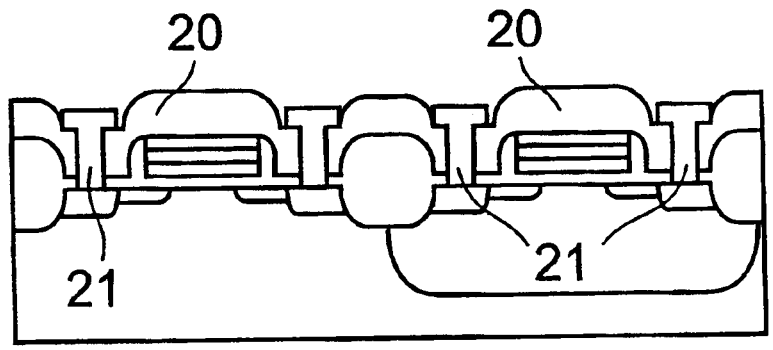
Figure 3A:
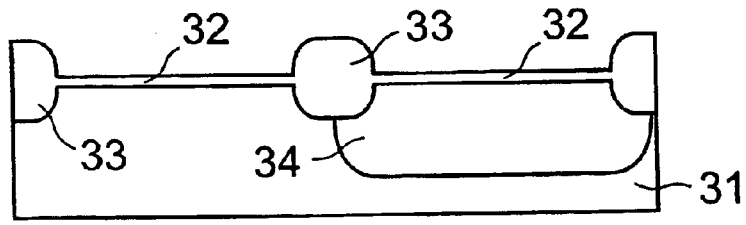
FIGS. 3A to 3D are cross sectional views showing a conventional manufacturing method.
Figure 3B:
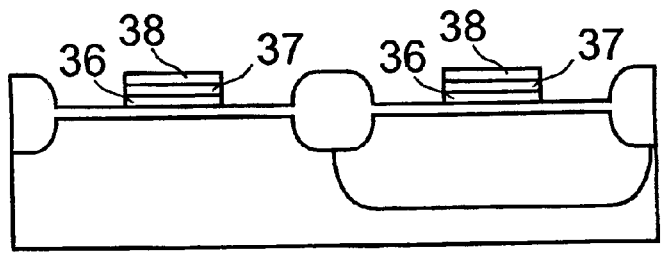
Figure 3C:
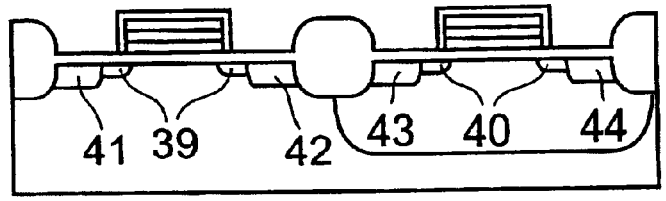
Figure 3D:
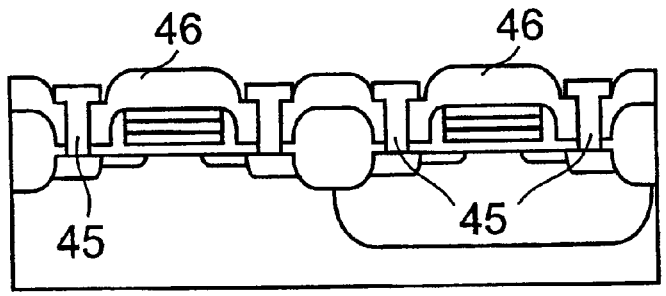

Finally, as in the case where an ordinary integrated circuit is manufactured, a phosphorus glass layer 20 is formed as an interlayer insulating film. For example, a low pressure CVD method is preferably be used for the formation of the phosphorus glass layer. Monosilane ($SiH_4$), oxygen ($O_2$), and phosphine ($PH_3$) are used as material gases and reacted at 450° C. to obtain the phosphorus glass layer 20. Then, holes for electrode formation are formed in the interlayer insulating film and aluminum electrodes 21 are formed therein. Thus, a complementary MOS device shown in FIG. 2C is completed.

When the P-type polycrystalline silicon gate electrode is used as the gate electrode in the P-type transistor manufactured by the above manufacturing method, the channel of an enhancement P-type transistor becomes a surface channel from a relationship of work functions between the N-well 4 and the gate electrode. However, in the case of a surface channel P-type transistor, even when a threshold voltage is set to, for example, −0.5V or more, extreme deterioration of a subthreshold coefficient does not occur and both low voltage operation and low consumption power are possible.

On the other hand, in the case of an N-channel transistor, the channel of an enhancement N-type transistor becomes a buried channel from a relationship of work functions between the P-type polycrystalline silicon gate electrode 6 and the P-type semiconductor substrate 1. However, when a threshold value is set to a desired value, since arsenic having a small diffusion coefficient can be used as a donor impurity for controlling a threshold value, the channel becomes an extremely shallow buried channel. Thus, even when a threshold voltage is set to, for example, a small value of 0.5 V or lower, as compared with the case of an enhancement P-type transistor in which boron having a large diffusion coefficient and a wide projection range in ion implantation must be used as an acceptor impurity for controlling a threshold value so that the channel becomes a deep buried channel and N-type polycrystalline silicon is used for the gate electrode, deterioration of a subthreshold and an increase in a leak current can be greatly suppressed.

From the above descriptions, it is understood that the technique for the CMOS in which the P-type polycrystalline silicon unipole is used as the gate electrode according to the present invention is effective for low voltage operation and low consumption power, as compared with a conventional CMOS in which an $N^+$-polycrystalline silicon unipole is used as the gate electrode.

Also, a so-called homopolar gate CMOS technique is generally known for low voltage operation and low consumption power. However, since gate electrodes are separately formed as a P-type one and an N-type one in homopolar gate formation, it is necessary to add at least two mask steps as compared with general unipolar gate processes. The standard number of mask steps in the case of a unipolar gate CMOS is about 10. However, when the homopolar gate is used, a step cost is increased by 20% at a rough estimate. Thus, from total viewpoints of a performance and a cost of the semiconductor device, the CMOS using the P-type polycrystalline silicon unipole as the gate electrode according to the present invention may be effective.

According to the embodiment of the present invention, in a semiconductor integrated circuit device in which the number of P-type transistors to be used therein is relatively larger than that of the N-type transistors, the P-type transistor is composed of a surface channel type transistor such that a channel length is easily reduced for a short channel. Thus, improvement of the drive capacity and miniaturization are promoted.

Also, when a buried channel which is not suitable for a short channel is applied to the N-type transistor, it is disadvantageous for only the N-type transistor. However, when it is compared with a conventional buried channel P-type transistor in terms of performance, the drive capacity can be improved more greatly than the conventional art. This is because, even if the N-type transistor and the P-type transistor have an identical channel length, an electron as a carrier of the N-type transistor has a larger mobility than a hole as a carrier of the P-type transistor.

Also, when a minimum channel length of the N-type transistor is determined, there is a case where such a length is not necessarily determined by a short channel effect. This is the case where bipolar operation (snap-back phenomenon) due to a substrate current of the N-type transistor is caused. This is because a drain current and a drain electric field are increased with realizing a short channel and generation of a hot carrier is promoted. On the other hand, since the number of generations of hot carriers in the P-type transistor is extremely smaller than as in the N-type, a case seldom occurs where the channel length is determined by the snap-back phenomenon. In other words, in the case of an application as in the present invention, it is opposite to common sense with respect to miniaturization and a short channel is easy to obtain in the P-type transistor rather than the N-type transistor. From such a viewpoint, it is very effective that the P-type transistor of the present invention is composed of a surface channel type and the N-type transistor thereof is composed of a buried channel type.

Further, the number of generations of hot carriers in the N-type transistor is smaller in the buried channel type rather than the surface channel type. As for hot carrier regions of the surface channel type transistor and the buried channel type transistor, the hot carrier generation region in the surface channel is formed near the gate oxide film. On the other hand, the hot carrier generation region in the buried channel is formed in a region deeper than the gate oxide film. Thus, a hot carrier is trapped and a distance between the gate oxide film and the channel region, by which deterioration of a transistor characteristic is caused, is increased to reduce the deterioration of the transistor characteristic.

Also, when a limitation of a short channel of the N-type transistor is not determined by a leak current, this becomes a cause to allow breaking through the limitation of the short channel due to the snap-back phenomenon. In other words, in this case, the short channel of the N-type transistor can be also promoted.

Since the P-type polycrystalline silicon is used for the gate electrode of the thus obtained transistor which composes the complementary type transistor device, the channel of the P-type transistor is produced as the surface channel and the channel of the N-type transistor is produced as the buried channel. The surface channel P-type transistor has stability of its transistor characteristic, reliability, and performance, which are superior to the conventional buried channel P-type transistor. In particular, when the channel is shortened, a leak current between the source and the drain can be greatly decreased and miniaturization is made easily.

According to the present invention, the semiconductor device based on silicon is mainly described. However, the present invention can be also applied to a semiconductor device using another material such as germanium, silicon carbide, or gallium arsenide. Further, in the present invention, a reduction in a resistance of the gate electrode serves an important role. In addition to the silicon gate, which is mainly described in the present invention, a material capable of producing a surface channel in the P-type transistor may be used for the gate electrode. Manufacturing steps of the transistors on the P-type semiconductor substrate are described in this embodiment. However, the present invention can be also applied to the case where a thin film transistor (TFT) is manufactured using a polycrystalline or a single crystalline semiconductor film which is formed on an insulating substrate made of quartz, sapphire, or the like.

According to the embodiment of the present invention, there are the following effects by employing the above-mentioned structure.

(1) The semiconductor device manufacturing method is employed, which includes: a step of forming a gate insulating film; a step of nitriding the gate insulating film; a step of performing thermal treatment using an inert gas; a step of forming a gate electrode on the gate insulating film; and a step of introducing a p-type impurity into the gate electrode. As a result, the N-type transistor becomes the buried channel type transistor and the P-type transistor becomes the surface channel type transistor. Thus, when the channel length is determined by the snap-back phenomenon, the reduction in a channel length is in the P-type transistor rather than the N-type transistor. Particularly, in the case of the semiconductor integrated circuit device for a voltage regulator, since a ratio of an area occupied by the P-type transistor is very large, effects of high speed drive and miniaturization due to a short channel of the P-type transistor are large and a cost reduction effect is also remarkable. Further, the hot carrier generation region in the surface channel is formed near the gate oxide film. However, the hot carrier generation region in the buried channel is formed in a region deeper than the gate oxide film. Thus, there is an effect that a hot carrier is trapped and a distance between the gate oxide film and the channel region, by which deterioration of a transistor characteristic is caused, is increased to reduce the deterioration of the transistor characteristic.

(2) The semiconductor device manufacturing method is employed, which includes the step of nitriding the gate insulating film. As a result, an interface level, a trap, a dangling bond of crystal in an interface of the gate insulating film are filled with nitrogen, with the result that a hot electron resistance is increased, and the reliability of the gate insulating film is improved. Further, it can be prevented that boron contained in the P-type polycrystalline silicon gate electrode passes the gate insulating film to penetrate the channel region of the transistor by thermal treatment in the manufacturing steps.

(3) With respect to a structure of the source and drain regions of the transistor, each of these is composed of a low impurity concentration region and a high impurity concentration region. In addition, an interval between the impurity regions having a high impurity concentration and the polycrystalline silicon gate electrode can be arbitrarily set. Thus, when a drain apply voltage is changed according to an application, there is provided an effect that it can be coped with by changing the interval between the impurity regions having a high impurity concentration and the polycrystalline silicon gate electrode without changing manufacturing step conditions.

(4) The method of manufacturing a semiconductor device in which the gate electrode has a polycide structure composed of a laminate of polycrystalline silicon, high melting metallic silicide, and an insulating film is used. Thus, when an N-type impurity is implanted using the P-type polycrystalline silicon gate electrode as a mask, it is possible that the implantation of the N-type impurity into the P-type polycrystalline silicon gate electrode is prevented. Therefore, there is an effect that an increase in a resistance and depletion of the gate electrode due to a reduction in a concentration of the P-type polycrystalline silicon gate electrode are prevented.

What is claimed is:

1. A method of manufacturing a CMOS semiconductor device including an N-channel MOS transistor and a P-channel MOS transistor, the method comprising the steps of:

forming source, drain and channel regions of the N-channel MOS transistor and the P-channel MOS transistor in a semiconductor substrate;

forming a gate insulating film over the channel regions;

nitriding the gate insulating film;

performing a thermal treatment on the CMOS device in an inert gas atmosphere after performing the step of nitriding the gate insulating film;

forming a gate electrode of each of the N-channel MOS transistor and the P-channel MOS transistor on the gate insulating film; and introducing a p-type impurity into the gate electrodes such that the gate electrodes of the N-channel MOS transistor and the P-channel MOS transistor have a p-type conductivity.

2. A method of manufacturing a CMOS semiconductor device according to claim 1; wherein the step of forming a gate electrode comprises the step of forming of polycrystalline silicon gate electrodes for the N-channel MOS transistor and the P-channel MOS transistor.

3. A method of manufacturing a CMOS semiconductor device according to claim 1; wherein the step of forming a gate electrode comprises the step of forming a multi-layer polycide structure comprised of a laminate of polycrystalline silicon, high melting metallic silicide, and an insulating film.

4. A method of manufacturing a CMOS semiconductor device according to claim 3; wherein the step of performing a thermal treatment is Performed using $N_2$ as the insert gas.

5. A method of manufacturing a CMOS semiconductor device according to claim 3; wherein the step of performing a thermal treatment comprises the step of performing an annealing temperature using the inert gas at a temperature of at least 925° C.

6. A method of manufacturing a CMOS semiconductor device according to claim 2; wherein the step of forming polycrystalline silicon gate electrodes comprises the steps of depositing a polycrystalline silicon film with a film thickness in the a range of 2000 Å to 5000 Å, and patterning the polycrystalline silicon film.

7. A method of manufacturing a CMOS semiconductor device according to claim 3; wherein the step of forming the multi-layer polycide structure comprises the steps of depositing a polycrystalline silicon film having a film thickness in the range of 2000 Å to 4500 Å, and depositing a high melting metallic silicon film having a film thickness in the range of 500 Å to 3000 Å.

8. A method of manufacturing a CMOS semiconductor device according to claim 3; wherein the step of introducing the P-type impurity is carried out using ion implantation.

9. A method of manufacturing a CMOS semiconductor device according to claim 3; wherein the step of introducing the P-type impurity comprises the steps of forming a glass film containing a P-type impurity on the on the crate electrode, and performing annealing.

10. A method of manufacturing a CMOS semiconductor device according to claim 3; wherein the step of introducing the P-type impurity comprises the steps of forming the gate electrode of a polycrystalline silicon by a low pressure CVD method in an atmosphere of a gas containing a P-type ion.

11. A method of manufacturing a CMOS semiconductor device according to claim 2; wherein the step of performing a thermal treatment is Performed using $N_2$ as the insert gas.

12. A method of manufacturing a CMOS semiconductor device according to claim 2; wherein the step of performing a thermal treatment comprises the step of performing an annealing temperature using the inert gas at a temperature of at least 925° C.

13. A method of manufacturing a CMOS semiconductor device according to claim 2; wherein the step of introducing the P-type impurity is carried out using ion implantation.

14. A method of manufacturing a CMOS semiconductor device according to claim 2; wherein the step of introducing the P-type impurity comprises the steps of forming a glass film containing a P-type impurity on the on the gate electrode, and performing annealing.

15. A method of manufacturing a CMOS semiconductor device according to claim 2; wherein the step of introducing the P-type impurity comprises the steps of forming the gate electrode of a polycrystalline silicon by a low pressure CVD method in an atmosphere of a gas containing a P-type ion.

16. A method of manufacturing a CMOS semiconductor device according to claim 1; wherein the step of performing a thermal treatment is performed using $N_2$ as the insert gas.

17. A method of manufacturing a CMOS semiconductor device according to claim 1; wherein the step of performing a thermal treatment comprises the step of performing an annealing temperature using the inert gas at a temperature of at least 925° C.

18. A method of manufacturing a CMOS semiconductor device according to claim 1; wherein the step of introducing the P-type impurity is carried out using ion implantation.

19. A method of manufacturing a CMOS semiconductor device according to claim 1; wherein the step of introducing the P-type impurity comprises the steps of forming a glass film containing a P-type impurity on the on the gate electrode, and performing annealing.

20. A method of manufacturing a CMOS semiconductor device according to claim 1; wherein the step of introducing the P-type impurity comprises the steps of forming the gate electrode of a polycrystalline silicon by a low pressure CVD method in an atmosphere of a gas containing a P-type ion.

21. A method of manufacturing a CMOS semiconductor device according to claim 1; wherein the step of nitriding the gate insulating film comprises the step of performing rapid thermal annealing (RTA).

22. A method of manufacturing a CMOS semiconductor device according to claim 21; wherein the step of performing RTA is conducted in an atmosphere of at least one of $N_2O$ and $NH_3$.

23. A method of manufacturing a CMOS semiconductor device according to claim 22; wherein the step of performing RTA is conducted at a temperature in the range of 800° C. to 1125° C. for 15 to 120 seconds.

24. A method of manufacturing a CMOS semiconductor device according to claim 21; further comprising the step of performing thermal processing after performing the RTA.

25. A method of manufacturing a CMOS semiconductor device according to claim 24; wherein the step of performing the thermal processing is conducted in an atmosphere of $O_2$ at a temperature in the range of 800° C. to 1125° for 15 to 120 seconds.

26. A method of manufacturing a CMOS semiconductor device according to claim 1; wherein the step of performing a thermal treatment comprises the step of annealing in an inert gas atmosphere to correct distortion of the substrate caused by nitriding of the gate insulating film.

27. A method of manufacturing a CMOS semiconductor device according to claim 1; wherein the step of forming a gate electrode comprises the step of forming and patterning a P-type polysilicon thin film on the gate insulating film to form gate electrodes of the NMOS and PMOS transistors.

28. A method of manufacturing a CMOS semiconductor device according to claim 27; wherein the P-channel MOS transistor is a surface channel device in an enhancement mode and the N-channel MOS transistor has a buried channel in the enhancement mode.

29. A method of manufacturing a CMOS semiconductor device according to claim 1; further comprising the step of implanting arsenic as a donor impurity for controlling a threshold value of the N-channel MOS transistor, so that the channel is an extremely shallow buried channel.

30. A method of manufacturing a CMOS semiconductor device according to claim 22; wherein the step of performing RTA is conducted at a temperature in the range of 800° C. to 1100° C. for 5 to 90 seconds.

* * * * *